(12) United States Patent
Shinozaki et al.

(10) Patent No.: US 8,085,588 B2
(45) Date of Patent: Dec. 27, 2011

(54) SEMICONDUCTOR DEVICE AND CONTROL METHOD THEREOF

(75) Inventors: Naoharu Shinozaki, Tokyo (JP); Kenji Arai, Tokyo (JP); Satoshi Sakurakawa, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 448 days.

(21) Appl. No.: 12/433,084

(22) Filed: Apr. 30, 2009

(65) Prior Publication Data

US 2010/0277987 A1   Nov. 4, 2010

(51) Int. Cl.
  *G11C 16/04* (2006.01)
(52) U.S. Cl. ......... 365/185.03; 365/185.11; 365/185.13; 365/185.12; 365/185.24; 365/189.05; 365/189.08
(58) Field of Classification Search ............. 365/185.03, 365/185.11, 185.13, 185.12, 185.24, 189.05, 365/189.08
See application file for complete search history.

(56) References Cited

U.S. PATENT DOCUMENTS

| | | | |
|---|---|---|---|
| 7,185,140 B2 | 2/2007 | Nakajima et al. | |
| 7,292,475 B2 | 11/2007 | Kodaira et al. | |
| 7,315,916 B2 * | 1/2008 | Bennett et al. | 711/103 |
| 7,317,636 B2 | 1/2008 | Ide et al. | |
| 7,366,826 B2 * | 4/2008 | Gorobets et al. | 711/103 |
| 7,451,264 B2 * | 11/2008 | Yero | 711/103 |
| 7,518,932 B2 * | 4/2009 | Barkley et al. | 365/185.29 |
| 2010/0082884 A1 * | 4/2010 | Chen et al. | 711/103 |
| 2010/0146186 A1 * | 6/2010 | Traister et al. | 711/103 |
| 2010/0318721 A1 * | 12/2010 | Avila et al. | 711/103 |

FOREIGN PATENT DOCUMENTS

| | | |
|---|---|---|
| JP | 06-084386 | 3/1994 |
| JP | 11-120086 | 4/1999 |
| JP | 2001-057096 | 2/2001 |

* cited by examiner

*Primary Examiner* — Viet Q Nguyen
(74) *Attorney, Agent, or Firm* — Frommer Lawrence & Haug LLP; Matthew M. Gaffney

(57) ABSTRACT

Systems and methods for programming data to a memory device (MD). The methods involve receiving the data at MD (100) from an external data source. MD includes a memory cell array (MCA) for storing the data including numbers in data blocks (DB) or memory cell array planes (MCAP). Each DB (122a, 122b, 122c, 122d) and MCAP (1020a, 1020b, 1020c, 1020d) includes memory addresses (Ads) corresponding to locations of respective transistor circuits ($202_1, 202_2, \ldots, 202_n, \ldots, 202_m$) within the MCA (120, 1020a, 1020b, 1020c, 1020d). Two or more of the transistor circuits have different threshold voltages (TVs) with respect to each other. The methods further involve programming the data to each DB or MCAP in accordance with a first mode. In the first mode, each number is programmed to a different MA of each DB or MCAP based at least in part on the different TVs.

20 Claims, 17 Drawing Sheets

FIG. 7

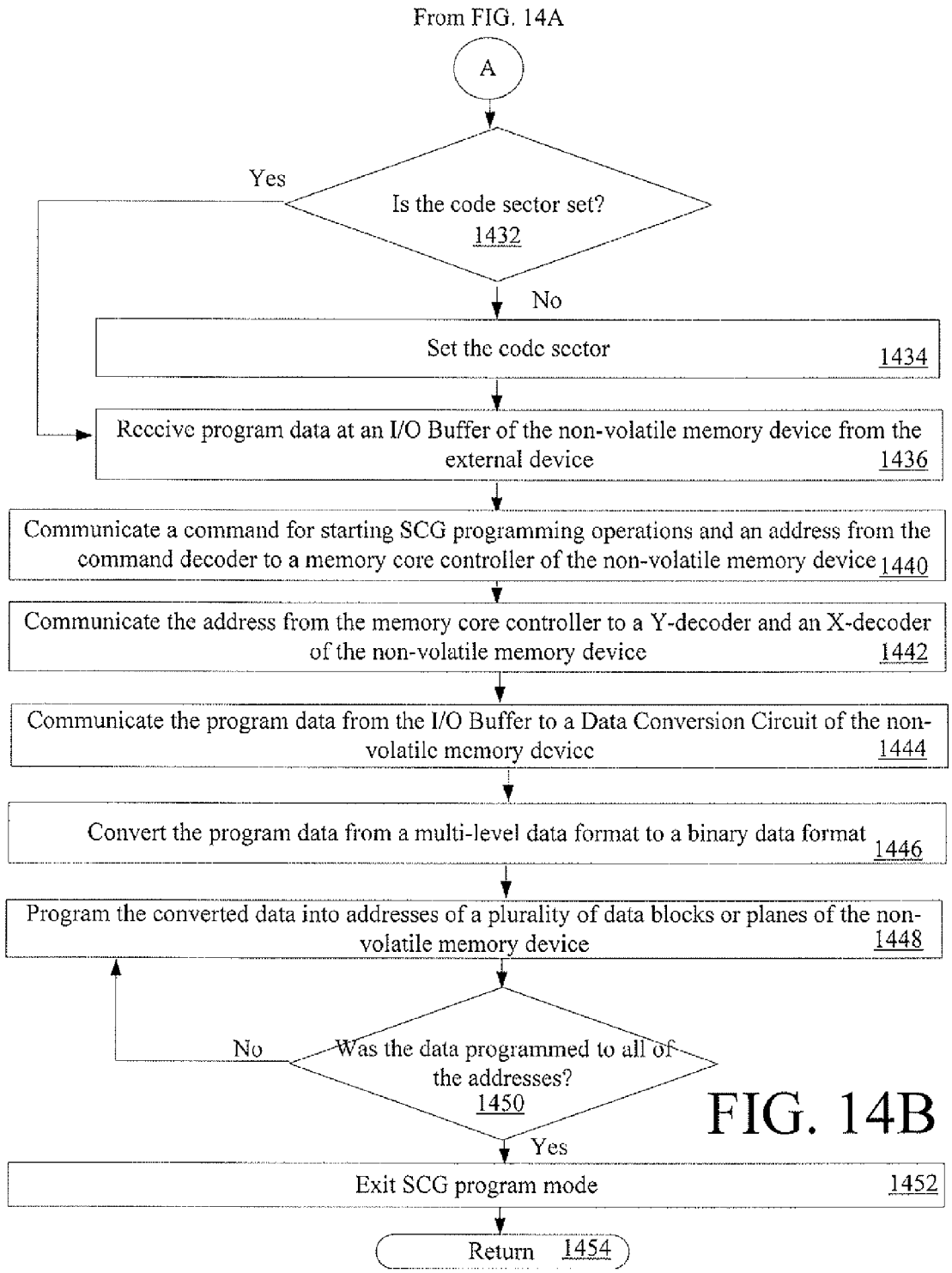

SEMICONDUCTOR DEVICE AND CONTROL METHOD THEREOF

BACKGROUND OF THE INVENTION

1. Statement of the Technical Field

The invention concerns multi-level data stores, such as a flash memory device, a Resistive Random Access Memory (ReRAM) device, and a Phase Change Memory (PCM) device. More particularly, the invention concerns circuits and methods for programming non-volatile memory.

2. Description of the Related Art

Non-volatile memory is generally computer memory that can retain stored information even when not powered. Examples of non-volatile memory include read-only memory (ROM), flash memory, hard disks, floppy disk drives, magnetic tapes, and optical disc drives. Flash memory can be a solid state storage device of a NAND type or a solid state storage device of a NOR type. NOR type flash memory has certain advantages over NAND type flash memory. For example, NOR type flash memory has more desirable data retention characteristics than NAND type flash memory. As such, NOR type flash memory has conventionally been used to store certain types of data, such as security data. Error correction codes (ECCs) have been employed for improving the reliability of NOR type flash memory. ECCs are generally codes inserted into the NOR type flash memory for detecting errors in the security data.

BRIEF DESCRIPTION OF THE DRAWINGS

Embodiments will be described with reference to the following drawing figures, in which like numerals represent like items throughout the figures, and in which:

FIG. 7 is an exemplary timing diagram for the threshold voltage conversion circuit shown in FIG. 6.

FIGS. 14A-14B collectively provide a flow diagram of an exemplary method for programming non-volatile memory according to an embodiment of the present invention.

DETAILED DESCRIPTION

Figure 1:
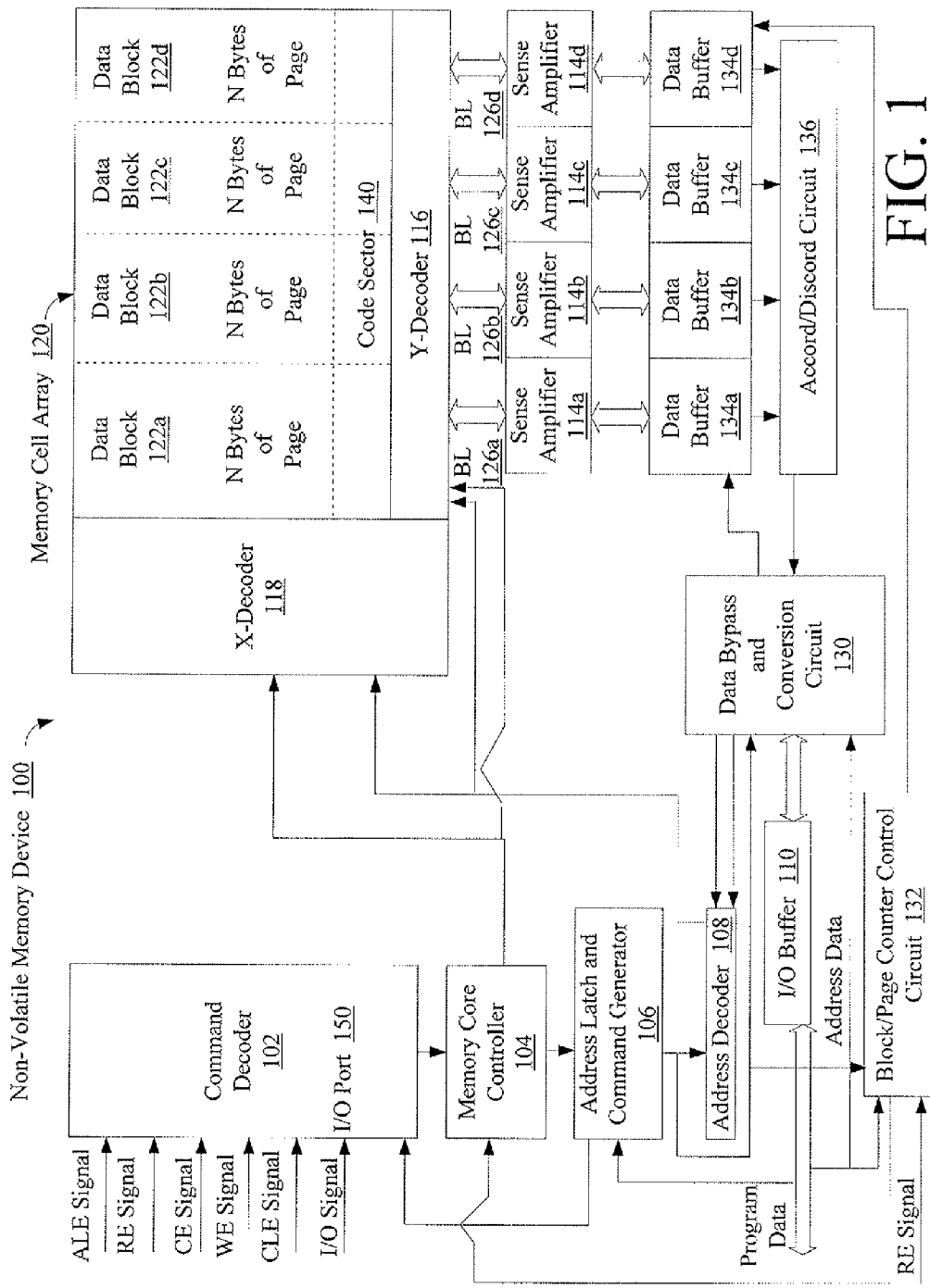
FIG. 1 is a block diagram of an exemplary non-volatile memory device according to an embodiment of the present invention.

The present invention is described with reference to the attached figures, wherein like reference numbers are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances.

Briefly stated, embodiments of the present invention are related to systems and methods for programming program data to a memory device. The methods involve receiving the program data at the memory device from an external data source. The memory device includes a memory cell array for storing program data including numbers in data blocks or memory cell array planes. Each data block and memory cell array plane includes memory addresses corresponding to locations of respective transistor circuits within the memory cell array. Each of the transistor circuits includes at least one unit cell transistor configured to have at least one number programmed therein. The unit cell transistor of a first one of the transistor circuits has a different threshold voltage with respect to the unit cell transistor of at least a second one of the transistor circuits. The methods further involve programming the program data to each of the data blocks or memory cell array planes in accordance with a Super Code Grade mode. In the Super Grade mode, each of the numbers is programmed to a different memory address of each of the data blocks or memory cell array planes based at least in part on the different threshold voltages.

In embodiments of the present invention, width distributions differ by the threshold voltage associated therewith. In other words, read margins differ. Since the memory address is shifted at each data block (or memory cell array plane) and the same data is read from a plurality of data blocks (or memory cell array planes), the read margin can be averaged. Therefore, the reliability of data read from the plurality of data blocks and memory cell array planes is high.

Referring now to FIG. 1, there is provided a block diagram of an exemplary non-volatile memory device 100 according to an embodiment of the present invention. The non-volatile memory device is a Flash memory device. Embodiments of the present invention are not limited in this regard. For example, embodiments of the present invention can also include a Resistive Random Access Memory (ReRAM) device or a Phase Change Memory (PCM) device.

As shown in FIG. 1, the non-volatile memory device 100 comprises a command decoder 102, a memory core controller 104, an address latch and command generator (AL/CG) 106, an address decoder 108, an Input/Output (I/O) buffer 110, a data bypass and conversion circuit (DBPCC) 130, a Block/Page Counter Control Circuit (B/PCCC) 132, an accord/discord circuit 136, at least one data buffer 134a, 134b, 134c, 134d, at least one sense amplifier 114a, 114b, 114c, 114d, a Y-decoder 116, an X-decoder 118, and at least one memory cell array 120.

Figure 2:
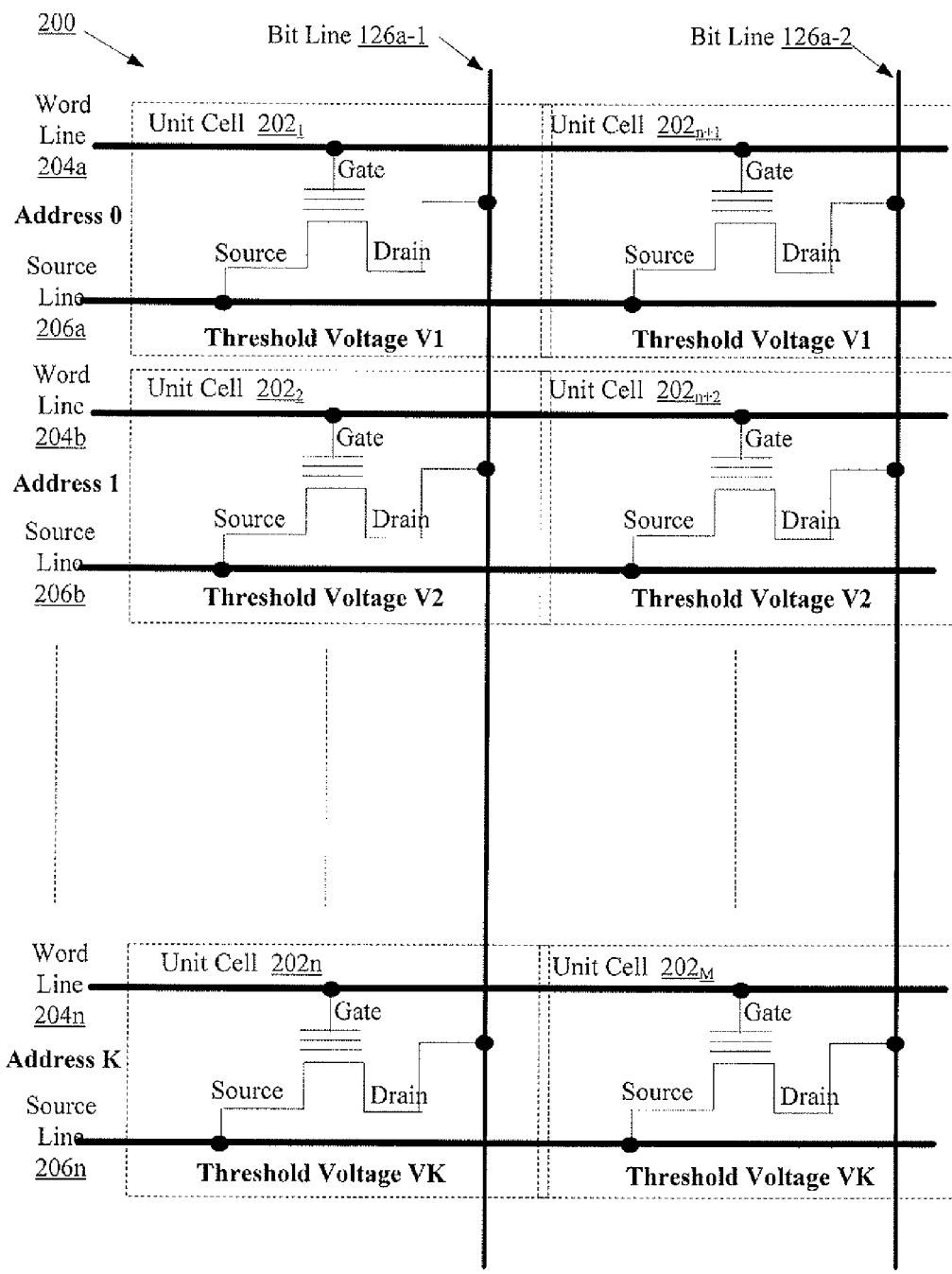
FIG. 2 is a schematic illustration of an exemplary memory cell structure of a data block of the memory cell array shown in FIG. 1.

The memory cell array 120 is configured to store at least one page (not shown) of data (e.g., two thousand forty eight (2048) bytes of data). For purposes of simplicity, the present invention will be described in accordance with a one page per memory cell array configuration. However, embodiments of the present invention are not limited in this regard. As shown in FIG. 1, the page (not shown) is stored in accordance with a block format. For example, if the memory cell array 120 comprises four (4) data blocks 122a, 112b, 122c, 122d, then each data block 122a, 122b, 122c, 122d includes 'N' bytes of the page (e.g., five hundred twelve (512) bytes of the page of data). Each data block 122a, 122b, 122c, 122d includes a plurality of memory unit cells (as shown in FIG. 2). A schematic illustration of an exemplary unit cell structure 200 of a data block 122a of the memory cell array 120 is provided in FIG. 2. The unit cell structure of each data block 122b, 122c, 122d is the same as or substantially similar to the unit cell structure 200 of the data block 122a. As such, the following discussion of the unit cell structure 200 of data block 122a is sufficient for understanding the unit cell structure 200 of data blocks 122b, 122c, 122d.

As shown in FIG. 2, each memory address 0, . . . , K of a data block 122a is defined by two (2) unit cells $202_1$, $202_2$, . . . , $202_n$, $202_{n+1}$, $202_{n+2}$, . . . , $202_M$, respectively. Each unit cell $202_1$, $202_2$, . . . , $202_n$, $202_{n+1}$, $202_{n+2}$, . . . , $202_M$ comprises a cell transistor coupled to a respective bit line 126a-1, 126a-2, a respective word line 204a, 204b, . . . , 204n, and a respective source line 206a, 206b, . . . , 206n. The cell transistor can be, but is not limited to, a Metal Oxide Semiconductor (MOS) floating gate memory transistor. Each bit line 126a-1, 126a-2 is coupled to the drains of the cell transistors, respectively. The unit cell defines a logic state, either a "1" or a "0", by storing two different levels of negative charge on the floating gate. The status of the floating gate is sensed during a read operation. For a logic "0" to be programmed into a unit cell, electrons are stored on the floating gate using the conditions defined for a "data program operation". Such conditions can include, but are not limited to, a high voltage (e.g., 10 Volts) applied at the drain via the bit line 126a-1, 126a-2, a high voltage applied at the gate via the word line 204a, 204b, . . . , 204n, and a low voltage (e.g., 0 Volts) applied to the source via the source line 206a, 206b, . . . , 206n. In effect, the threshold voltage V1, V2, . . . , VK of the cell transistor is greater than a reference voltage. For a logic "1" to be programmed into a unit cell, a reduced quality of electrons are stored on the floating gate using conditions defined for an "erase data program operation". Such conditions can include, but are not limited to, a high voltage applied at the source via the source line 206a, 206b, . . . , 206n and a low voltage (e.g., 0 Volts) applied to the gate via the word line 204a, 204b, . . . , 204n. In effect, the threshold voltage V1, V2, . . . , VK of the cell transistor is less than a reference voltage. Embodiments of the present invention are not limited in this regard. Any suitable unit cell structure of a data block, "data program operation", and "erase data program operation" can be used without limitation.

Referring again to FIG. 1, the Y-decoder 116 and the X-decoder 118 are communicatively coupled to the memory cell array 120. Each of the decoders 116, 118 is configured to select unit cells 202a, 202b, . . . , 202n (shown in FIG. 2) for the storage of data. The Y-decoder 116 is communicatively coupled to the one or more sense amplifiers 114a, 114b, 114c, 114d via bit lines 126a, 126b, 126c, 126d. Each sense amplifier 114a, 114b, 114c, 114d is an electronic amplifier circuit configured to sense (or read) and refresh (or program) the value of a bit stored in a memory cell (not shown) of a respective data block 122a, 122b, 122c, 122d. The sense amplifiers 114a, 114b, 114c, 114d are communicatively coupled to the data buffers 134a, 134b, 134c, 134d, respectively.

The data buffers 134a, 134b, 134c, 134d are generally used to temporarily hold data while it is being moved from one place to another. For example, data is stored in the data buffers 134a, 134b, 134c, 134d as it is retrieved from the memory cell array 120 or just before it is programmed (or written) to the memory cell array 120. The data buffers 134a, 134b, 134c, 134d can be implemented in either hardware or software. The data buffers 134a, 134b, 134c, 134d are communicatively coupled between the sense amplifiers 114a, 114b, 114c, 114d and the DBPCC 130. The data buffers 134a, 134b, 134c, 134d are also communicatively coupled to the B/PCCC 132. The B/PCCC 132 counts the number of data blocks to which data has been read from or programmed (or written) into. The B/PCCC 132 also controls which data buffer 134a, 134b, 134c, 134d is to receive data from or communicate data to the sense amplifier 114a, 114b, 114c, 114d.

The DBPCC 130 can generally include a data bypass circuit (not shown) and a data conversion circuit (not shown). In general, the data bypass circuit (not shown) temporarily stores data that is to be programmed (or written) to the memory cell array 120 or read from the memory cell array 120. The data bypass circuit (not shown) receives data to be programmed (or written) to the memory cell array 120 from the I/O buffer 110 and communicates data read from the memory cell array 120 to the I/O buffer 110. The I/O buffer 110 is communicatively coupled to an external data source (not shown) so as to received data therefrom or communicate data thereto.

With regard to the programming of data, the data bypass circuit (not shown) can be utilized when the non-volatile memory device 100 is in a normal program mode. In this normal program mode, data is generally programmed (or written) to the memory cell array 120 in accordance with conventional normal program mode operations. Such conventional normal program mode operations can generally involve communicating data from the I/O buffer 110 to one or more sense amplifiers 114a, 114b, 114c, 114d. At the sense amplifiers 114a, 114b, 114d, the data is communicated to the memory cell array 120 via at least one bit line 126a, 126b, 126c, 126d. Such conventional normal program mode operations can also generally involve communicating information on at least one word line 204a, 204b, . . . , 204n to the memory cell array 120 for programming (or writing) data to an address specified by the memory core controller 104.

In general, the data conversion circuit (not shown) receives data to be programmed (or written) to the memory cell array 120 from the I/O buffer 110 and communicates data read from the memory cell array 120 to the I/O buffer 110. The data conversion circuit (not shown) can be utilized when the non-volatile memory device is in its Super Code Grade (SCG) mode.

In this SCG mode, data is generally programmed to the memory cell array 120 in accordance with SCG mode operations. Such SCG mode operations generally involve setting the code sector 140 and communicating data from the I/O buffer 110 to the data conversion circuit of the DBPCC 130. At the data conversion circuit, the data is converted to change its threshold voltage and replace multi-level program data with binary program data. The phrase "multi-level program data", as used herein, refers to hierarchically structured data. The SCG mode operations also generally involve communicating the converted data from the DBPCC 130 to one or more sense amplifiers 114a, 114b, 114c, 114d via the data buffer(s) 134a, 134b, 134c, 134d. The SCG mode operations further generally involve communicating information on at least one word line 204a, 204b, . . . , 204n to the memory cell array 120 for programming (or writing) data to an address specified by the memory core controller 104. An exemplary embodiment of the conversion circuit (not shown) will be described below in relation to FIG. 3.

As shown in FIG. 1, the DBPCC 130 is communicatively coupled to the accord/discord circuit 136. The accord/discord circuit 136 is utilized during read operations. For example, data read from the memory cell array 120 is processed by the accord/discord circuit 136 to determine whether an accord or discord is found in the data.

The command decoder 102 receives command signals from external command generating devices (not shown). Such command signals include, but are not limited to, an Address Latch Enable (ALE) signal, a Read Enable (RE) signal, a Chip Enable (CE) signal, a Write Enable (WE) signal, a Command Latch Enable (CLE) signal, an I/O signal, and a Ready/Busy (RY/BY) signal (not shown). The ALE signal controls writing to the address latch 106. When the ALE signal is high, the address is loaded on the falling edge of the WE signal. The ALE signal remains high during an entire address sequence. The RE signal controls the data output which is triggered on the falling edge of the RE signal. The RE signal also controls the output on the I/O port 150 of the command decoder 102. The CE signal controls the mode of the non-volatile memory device 100. During a command or address load sequence, the CE signal is low prior to the falling edge of the WE signal. The WE signal controls the data and command of the I/O signal during a write sequence. The CLE signal controls writing to the command register (not shown). When the CLE signal is high, the command is loaded on the falling edge of the WE signal. The I/O signal includes command information, address information, and data communicated to and from the command decoder 102. The RY/BY signal (not shown) indicates the operation status of the non-volatile memory device 100. When the RY/BY signal (not shown) is high, the non-volatile memory device 100 is ready form a next operation. When the RY/BY signal (not shown) is low, the non-volatile memory device 100 is performing an operation such as a an erase operation, a read operation, a normal mode program operation, an SCG program mode operation, or other memory related operation.

The command decoder 102 is communicatively coupled to the memory core controller 104. The command decoder 102 communicates commands to the memory core controller 104 for controlling the operations of the non-volatile memory device 100. The memory core controller 104 controls the operations of the Y-decoder 116 and the X-decoder 118.

The AL/CG 106 receives address information from an external device (not shown) and processes the same. The AL/CG 106 communicates signals to the command decoder 102 indicating the status of the non-volatile memory device 100. The AL/CG 106 also communicates signals to the address decoder 108 indicating a memory address to which data is to be read from or the memory cell $202_1$, $202_2$, . . . , $202_n$, $202_{n+1}$, $202_{n+2}$, . . . , $202_M$ that is to have its value refreshed. The address decoder 108 communicates address information to the Y-decoder 116 and the X-decoder 118.

Figure 10:
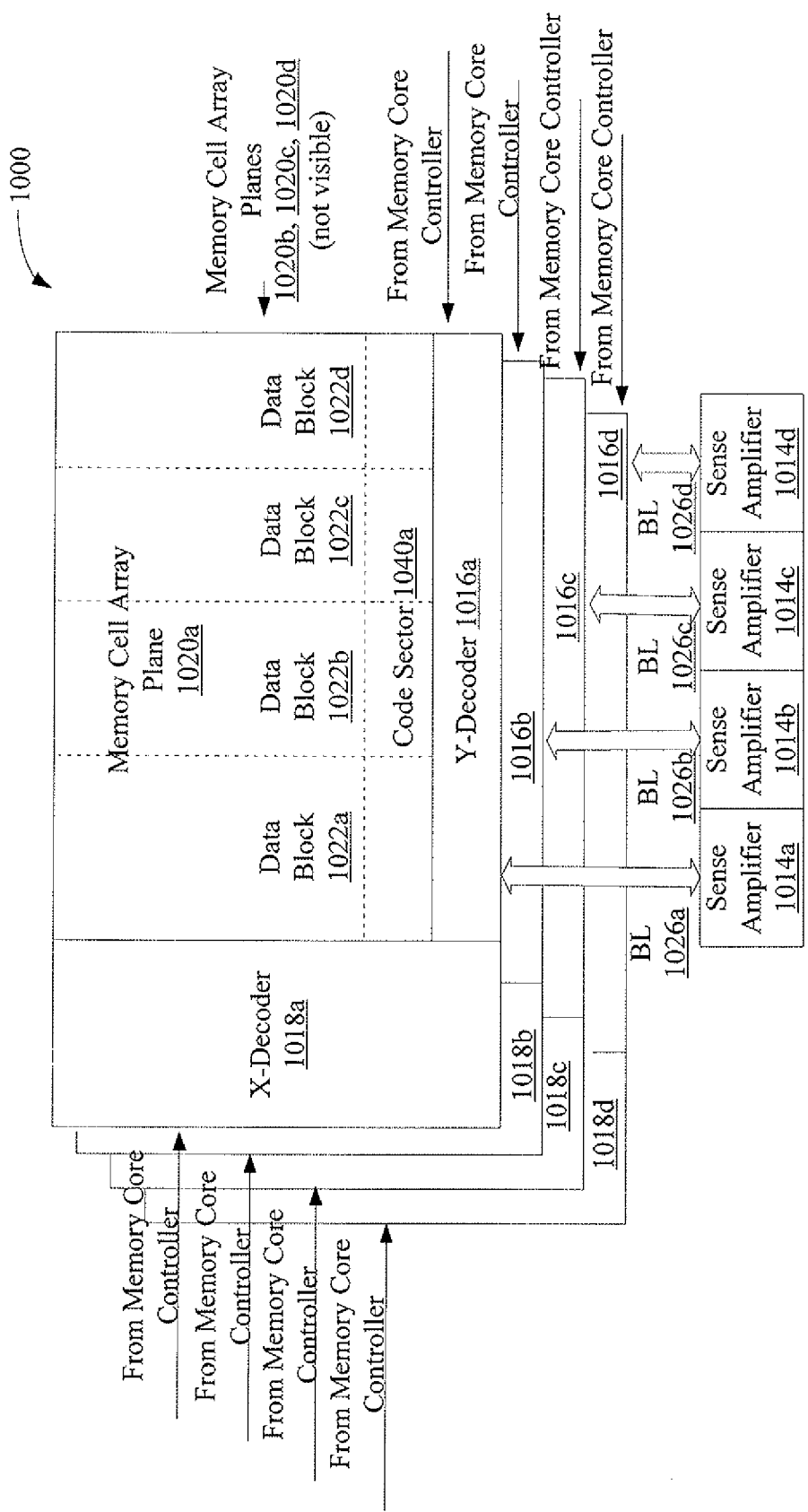
FIG. 10 is a schematic illustration of a multi-memory cell array configuration according to an embodiment of the present invention.

Although a single memory cell array 120 is shown in FIG. 1, embodiments of the present invention are not limited in this regard. For example, the non-volatile memory device 100 can include one or more memory cell arrays. A schematic illustration of a multi-memory cell array configuration 1000 is provided in FIG. 10. As shown in FIG. 10, the multi-memory cell array configuration 1000 comprises a plurality of X-decoders 1018a, 1018b, 1018c, 1018d, a plurality of Y-decoders 1016a, 1016b, 1016c, 1016d, a plurality of stacked memory cell array planes 1020a, 1020b, 1020c, 1020d, and at least one sense amplifier 1014a, 1014b, 1014c, 1014d. The stacked memory cell array planes 1020a, 1020b, 1020c, 1020d can be assembled in a package, such as a Multi-Chip Package (MCP) and a Package on Package (PoP).

The sense amplifier(s) 1014a, 1014b, 1014c, 014d can be communicatively coupled to the memory cell array planes 1020a, 1020b, 1020c, 1020d via bit lines 1026a, 1026b, 1026c, 1026d. Each of the bit lines 1026a, 1026b, 1026c, 1026d is provided for communications between the sense amplifier(s) 1014a, 1014b, 1014c, 1014d and a particular one of the memory cell array planes 1020a, 1020b, 1020c. Each of the decoders 1016a, 1016b, 1016c, 1016d, 1018a, 1018b, 1018c, 1018d is the same as or substantially similar to the decoders 116, 118 of FIG. 1, respectively. Accordingly, each of the decoders 1016a, 1016b, 1016c, 1016d, 1018a, 1018b, 1018c, 1018d is configured to receive communications from a memory core controller (not shown). The memory core controller (not shown) is the same as or substantially similar to the memory core controller 104 of FIG. 1.

As should be understood, the multi-memory cell array configuration 1000 can further include additional components which are not shown for simplicity purposes. The additional components can include, but are not limited to, a command decoder, a memory core controller, an address latch and command generator, an address decoder, an I/O buffer, a block/page counter control circuit, a data latch and conversion circuit, data buffers, and an accord/discord circuit. These listed additional components can be the same as or substantially similar to the respective components 102, . . . , 110, 130, . . . , 136 of FIG. 1.

Notably, the memory cell array configuration 120 of FIG. 1 and the multi-memory cell array configuration 1000 of FIG. 10 can provide non-volatile memory devices with highly reliable data program operations. In this regard, it should be understood that a defective programming (or writing) of data can be prevented by programming data to two or more data blocks or planes. This multi-block/plane programming can be facilitated by changing the threshold voltage of the addresses and changing the place (or address) where the data is stored in each block/plane. This multi-block/plane programming feature of the present invention will become more evident as the discussion progresses. Also, the memory cell array configuration 120 of FIG. 1 and the multi-memory cell array configuration 1000 of FIG. 10 eliminates the need for Error Correction Codes. As such, non-volatile memory devices require less hardware and/or software than conventional non-volatile memory devices. In effect, the non-volatile memory devices of the present invention takes up less area of a circuit space than conventional non-volatile memory devices.

Figure 3:
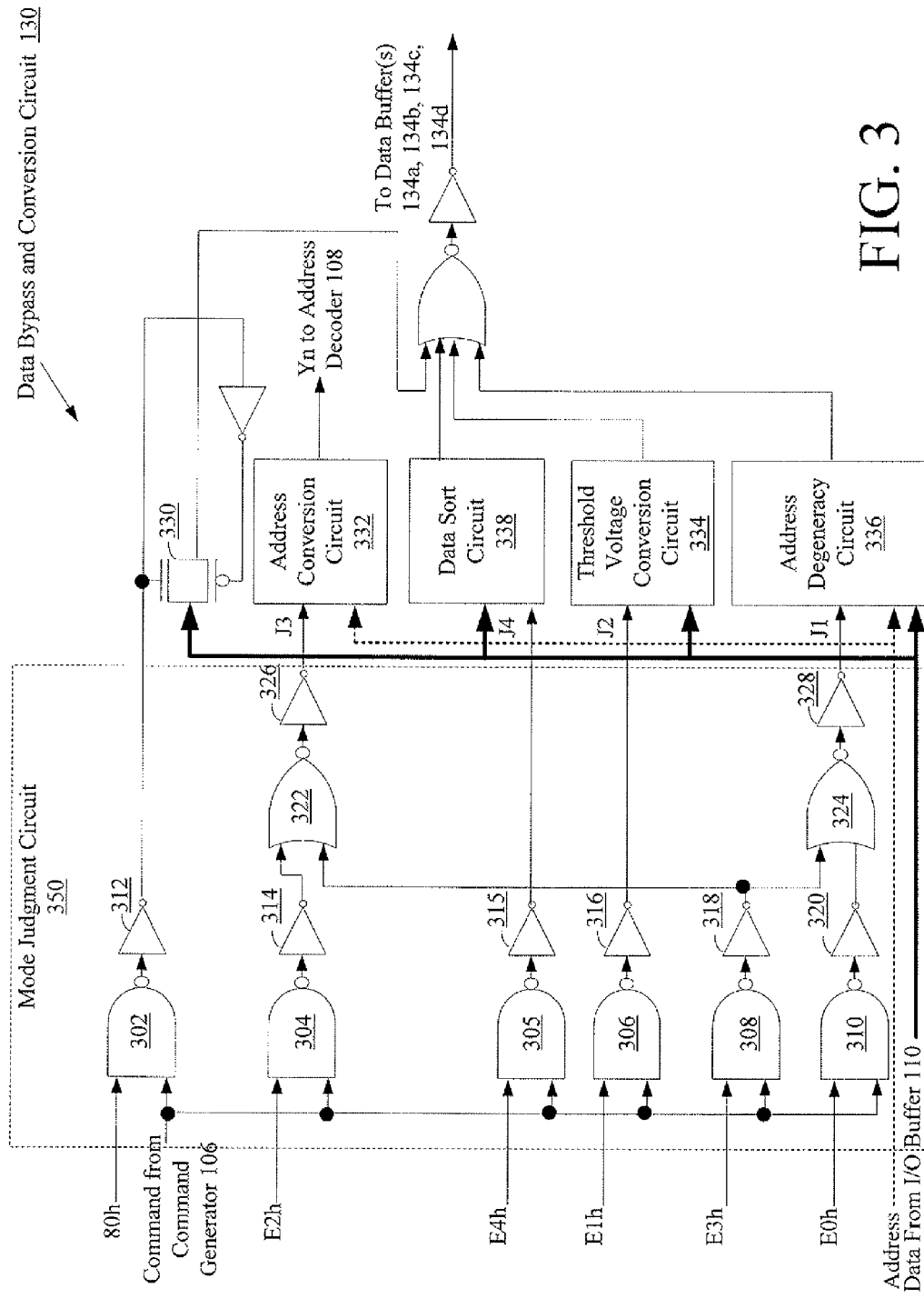
FIG. 3 is a block diagram of an exemplary data conversion circuit according to an embodiment of the present invention.

Referring now to FIG. 3, there is provided a schematic illustration of an exemplary DBPCC 130 according to an embodiment of the present invention. As shown in FIG. 3, the DBPCC 130 is generally configured to convert program data to replace multi-level program data with binary program data and to change the place (or address) where bits of the binary program data is stored in each block/plane. Accordingly, the DBPCC 130 comprises a mode judgment circuit (MJC) 350, a switch 330, an address conversion (AC) circuit 332, a data sort circuit 338, a threshold voltage conversion (TVC) circuit 334, and an address degeneracy (AD) circuit 336.

The MJC 350 is generally configured to set the mode of the DBPCC 130 in accordance with a command (e.g., 80h, E0h, E1h, E2h, E3h and/or E4h) received thereat. Accordingly, the MJC 350 includes NAND gates 302, 304, 305, 306, 308, 310, NOT gates 312, 314, 315, 316, 318, 320, 326, 328, and NOR gates 322, 324.

If the command "80h" is received at the MJC 350, then the mode of the DBPCC 130 is set to normal mode. In such a scenario, data received from the I/O buffer 110 is forwarded to the data buffers 134a, 134b, 134c, 134d without being converted. Also, the address "Yn" received from an external device (not shown) is forwarded to the address decoder 108 without being converted.

If the command "E0h" is received at the MJC 350, then the mode of the DBPCC 130 is set to an address degeneracy mode. In this address degeneracy mode, a command judge signal "J1" received from the command generator 106 is communicated from the MJC 350 to the AD circuit 336. The AD circuit 336 generally degenerates address data (i.e., all or a portion of received address data is substituted with substitute address data). The AD circuit 336 will be described in more detail below in relation to FIGS. 4 and 5.

If the command "E1h" is received at the MJC 350, then the mode of the DBPCC 130 is set to a threshold conversion mode. In this threshold conversion mode, a command judge signal "J2" received from the command generator 106 is communicated from the MJC 350 to the TVC circuit 334. The TVC circuit 334 generally processes threshold voltage data for conversion of the same. The TVC circuit 334 will be described in more detail below in relation to FIGS. 6 and 7.

If the command "E2h" is received at the MJC 350, then the mode of the DBPCC 130 is set to an address conversion mode. In this address conversion mode, a command judge signal "J3" received from the command generator 106 is communicated from the MJC 350 to the AC circuit 332. The AC circuit 332 generally process address data received from an external device (not shown) for converting the same. The AC circuit 332 will be described in more detail below in relation to FIGS. 8 and 9.

If the command "E3h" is received at the MJC 350, then the mode of the DBPCC 130 is set to a combined mode defined by the address conversion mode and the degeneracy mode. In this combined mode, command judge signals "J1" and "J3" received from the command generator 106 are communicated from the MJC 350 to the AC circuit 332 and the AD circuit 336, respectively. As a result, address data is processed by the AC circuit 332 to convert the same and the AD circuit 336 to be degenerated (i.e., all or a portion of the received address data is substituted with substitute address data).

Figure 16:
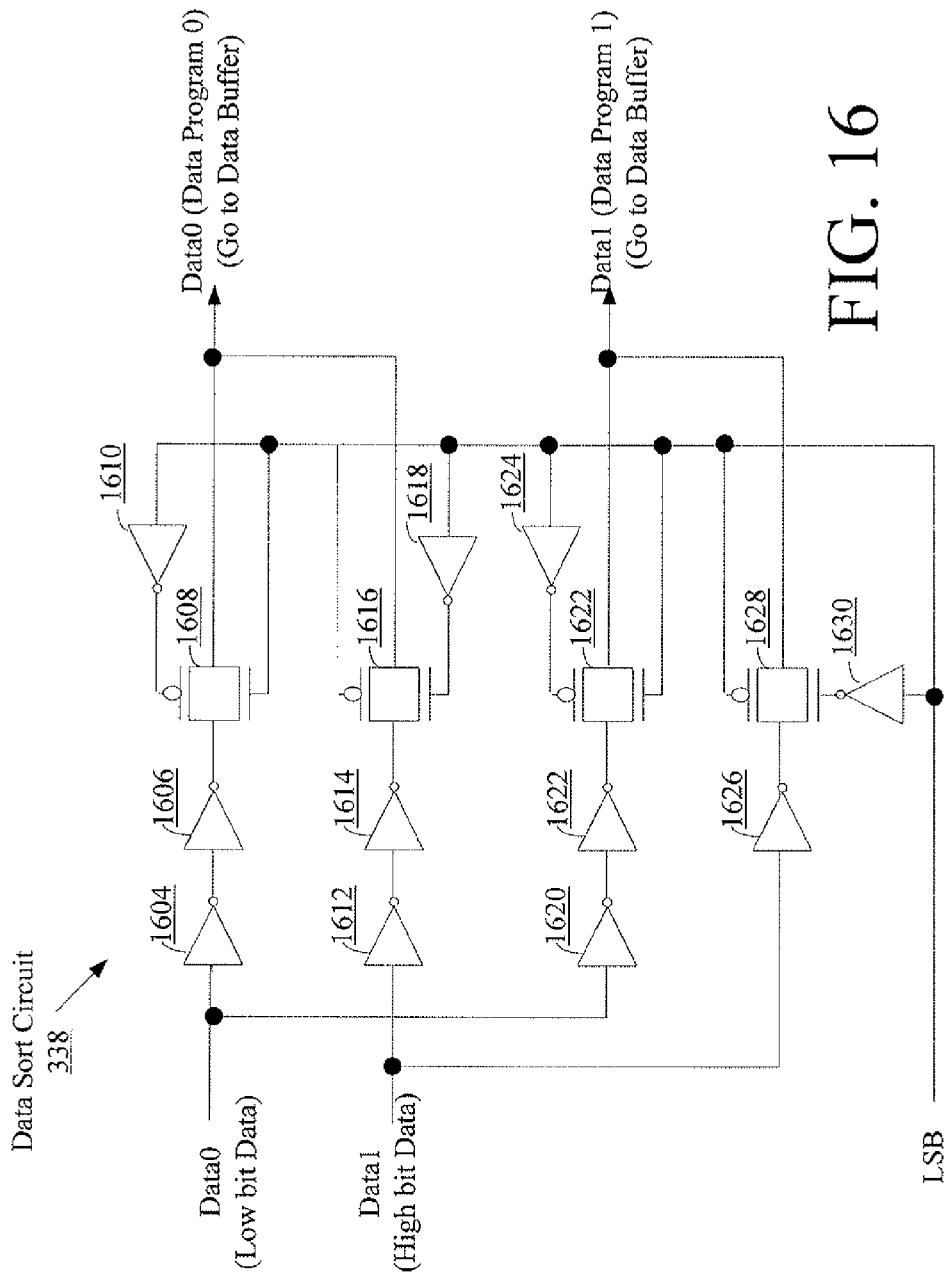
FIG. 16 is a schematic illustration of a data sort circuit that is useful for understanding the present invention.

If the command "E4h" is received at the MJC 350, then the mode of the DBPCC 130 is set to a data sort circuit mode. In this combined mode, command judge signal "J4" received from the command generator 106 is communicated from the MJC 350 to the data sort circuit 338. In such a scenario, data received from the I/O buffer 110 is forwarded to the data buffers 134a, 134b, 134c, 134d subsequent to being processed at the data sort circuit 338. The processing performed at the data sort circuit 338 generally involves extending the threshold (Vth) window width of the adjacent data via data distribution. As more detailed schematic illustration of an exemplary data sort circuit 338 is provided in FIG. 16. As shown in FIG. 16, the data sort circuit 338 comprises NOT gates 1604, 1606, 1610, . . . , 1614, 1618, . . . , 1626, 1630 and switches 1608, 1616, 1622, 1628. Embodiments of the present invention are not limited to the circuit configuration for the data sort circuit 338 shown in FIG. 16.

Figure 4:
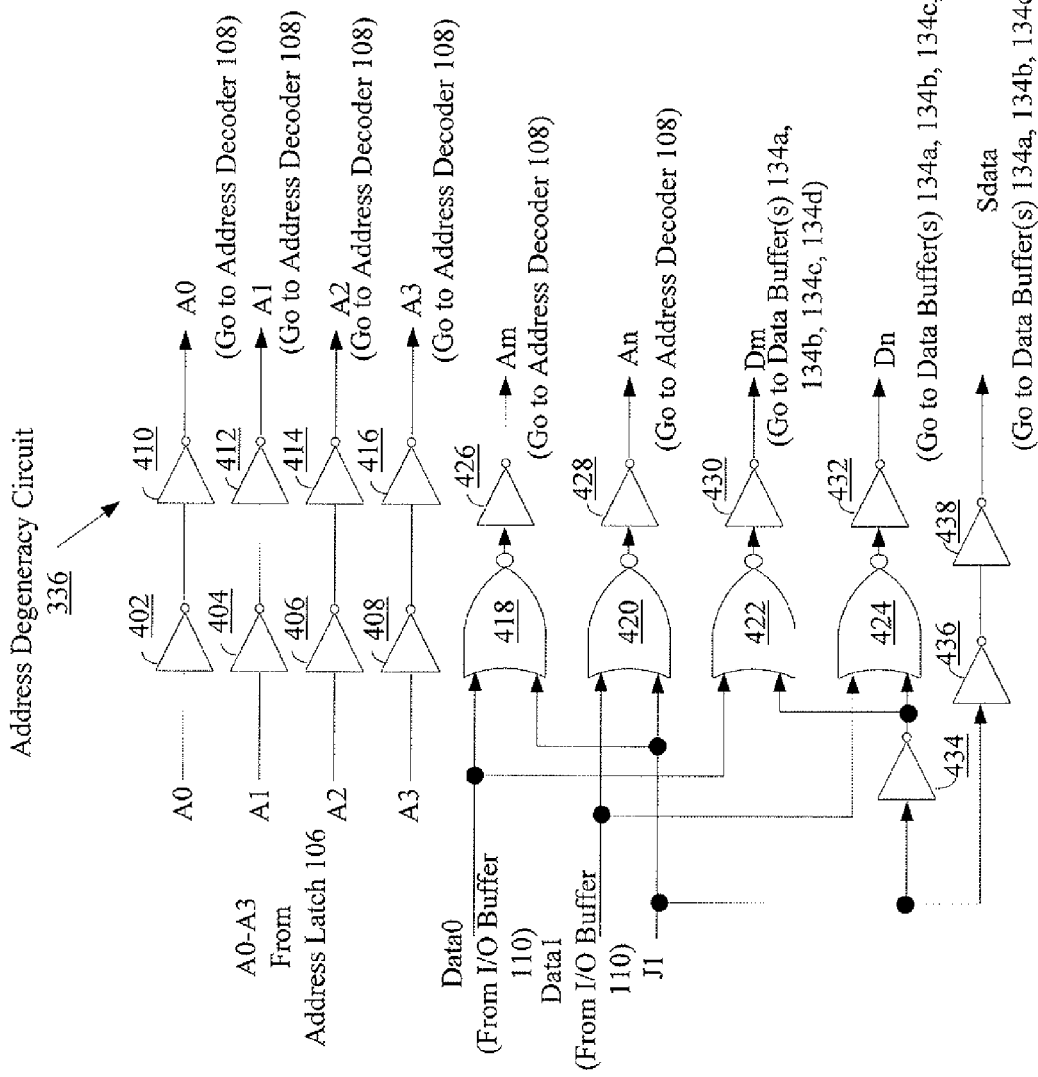
FIG. 4 is a schematic illustration of the address degeneracy circuit shown in FIG. 3 according to an embodiment of the present invention.
Figure 15:
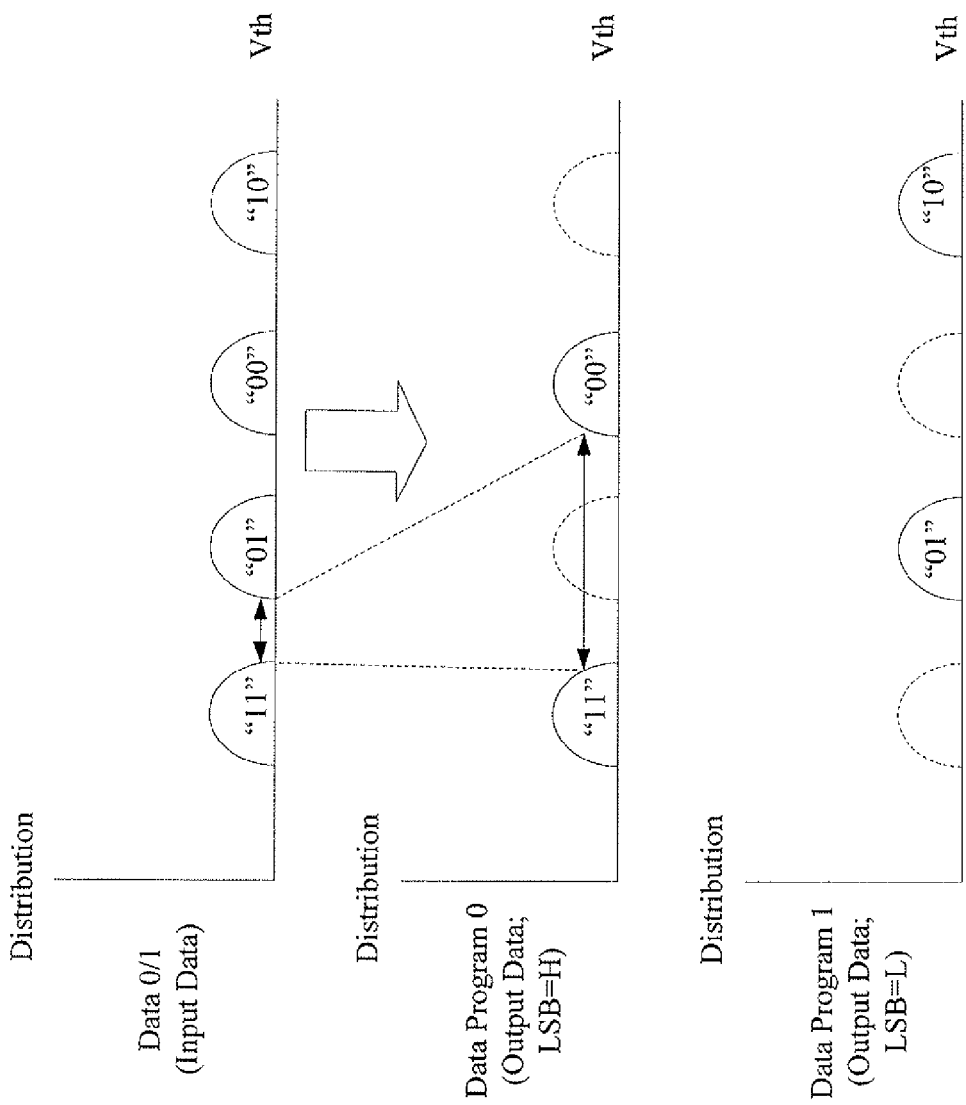
FIG. 15 is a conceptual diagram that is useful for understanding the purpose of an address degeneracy circuit.

Referring now to FIG. 4, there is provided a schematic illustration of the AD circuit 336 according to an embodiment of the present invention. A brief discussion of the purpose of the AD circuit 336 will be provided in relation to FIG. 15. As shown in FIG. 15, four input data values ("11", "01", "00", "10") of Data0/1 are to be written to Addr0. Therefore, four input data values exist in the same address. Data is degenerated from two (2) bits into one (1) bit by a signal Least Significant Bit (LSB) when the address is an even number address at this time. In the example shown in FIG. 15, data is degenerated because the address is zero (0). However, the address actually programmed becomes two (2) because it should program four (4) input data values. Data input values "11" and "00" are programmed to data block 122 of FIG. 1. Moreover, data input values "01" and "10" are programmed to data block 123 of FIG. 1. An external controller decides which data input values to write to which address. As a result of the existence of two (2) data input values existing at the same address, the Vth margin of data extends, and therefore the error due to the deterioration in data can be prevented.

Referring again to FIG. 4, the AD circuit 336 comprises NOT gates 402, 404, . . . , 416, 426, . . . , 438 and NOR gates 418, 420, 422, 424. Each of the NOT gates 402, 404, 40, 408 is configured to receive a respective address signal A0, A1, A2, A3 from an address latch 106 of FIG. 1. Each of the NOR gates 418, 420, 422, 424 is configured to receive a respective data signal Data0, Data1 from the I/O buffer 110. The NOR gate 420 is configured to receive a command judge signal "J1" from the MJC 350 of FIG. 3. When the command judge signal "J1" is at a first preselected level (e.g., a high level), then address signals Am and An are communicated from the AD circuit 336 to the address decoder 108 of FIG. 1. In contrast, when the command judge signal "J1" is at a second preselected level (e.g., a low level), address data Dm, Dn is substituted for addresses Am and An. The substitute program data Dm and Dn is communicated from the AD circuit 336 to the data buffers 134a, 134b, 134c, 134d. Also, the Sdata signal is communicated from the AD circuit 336 to the data buffers 134a, 134b, 134c, 134d of the FIG. 1. The SData signal includes information contained in the command judge signal "J1".

Figure 5:
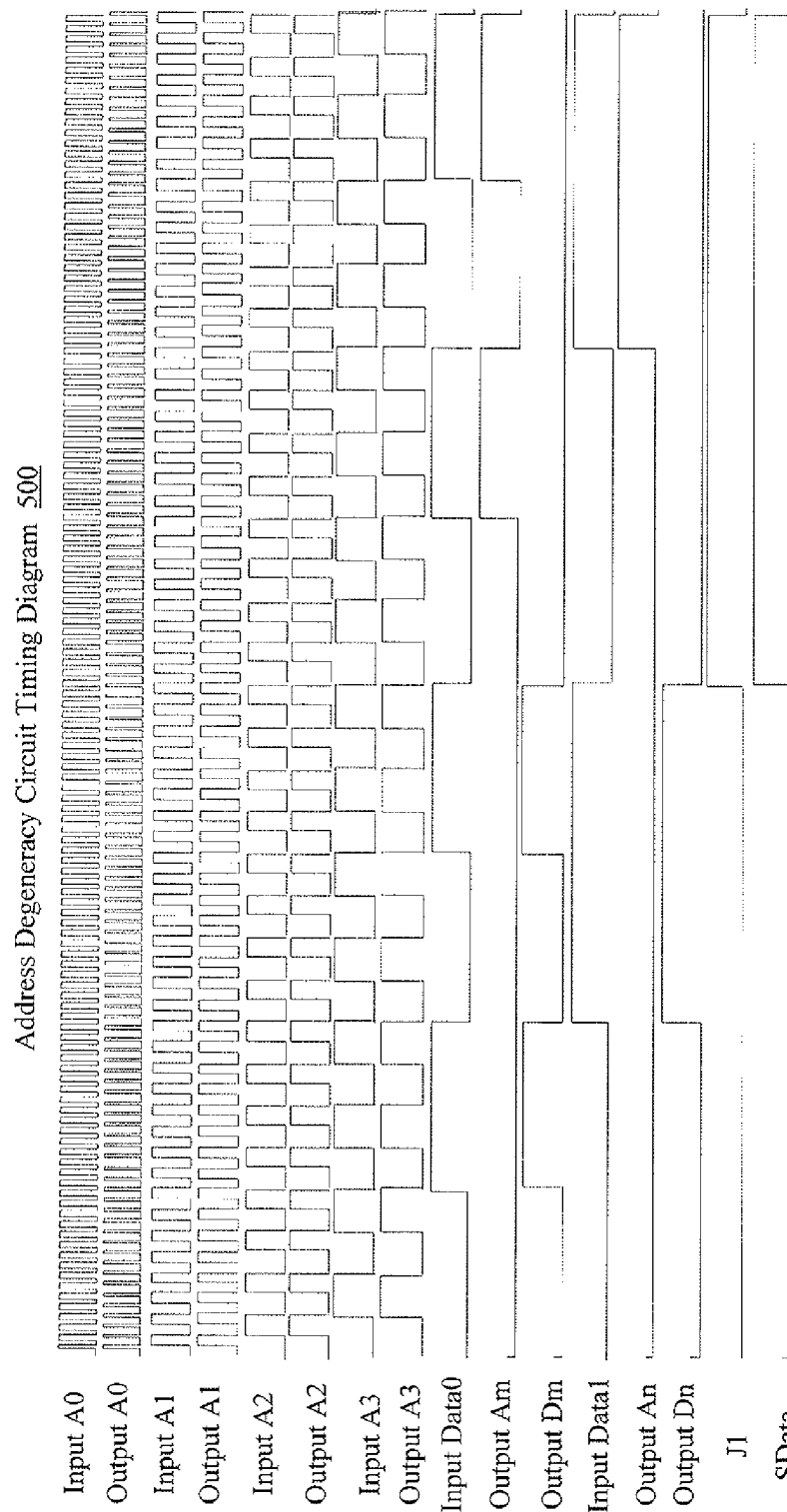
FIG. 5 is an exemplary timing diagram for the address degeneracy circuit of FIG. 4.

An exemplary timing diagram 500 of the AD circuit 336 is provided in FIG. 5. As shown in FIG. 5, the input address signals A0, A1, A2, A3 are simply forwarded from the AD circuit 336 to the address decoder 108 of FIG. The address data Am and An is output from the AD circuit 336 when the command judge signal "J1" is at a first preselected level (e.g., a high level). Also, the SData signal is output from the AD circuit 336 when the command judge signal "J1" is at the second preselected level. The substitute address data Dm and Dn is output from the AD circuit 336 when the command judge signal "J1" is at a second preselected level (e.g., a low level).

Figure 6:
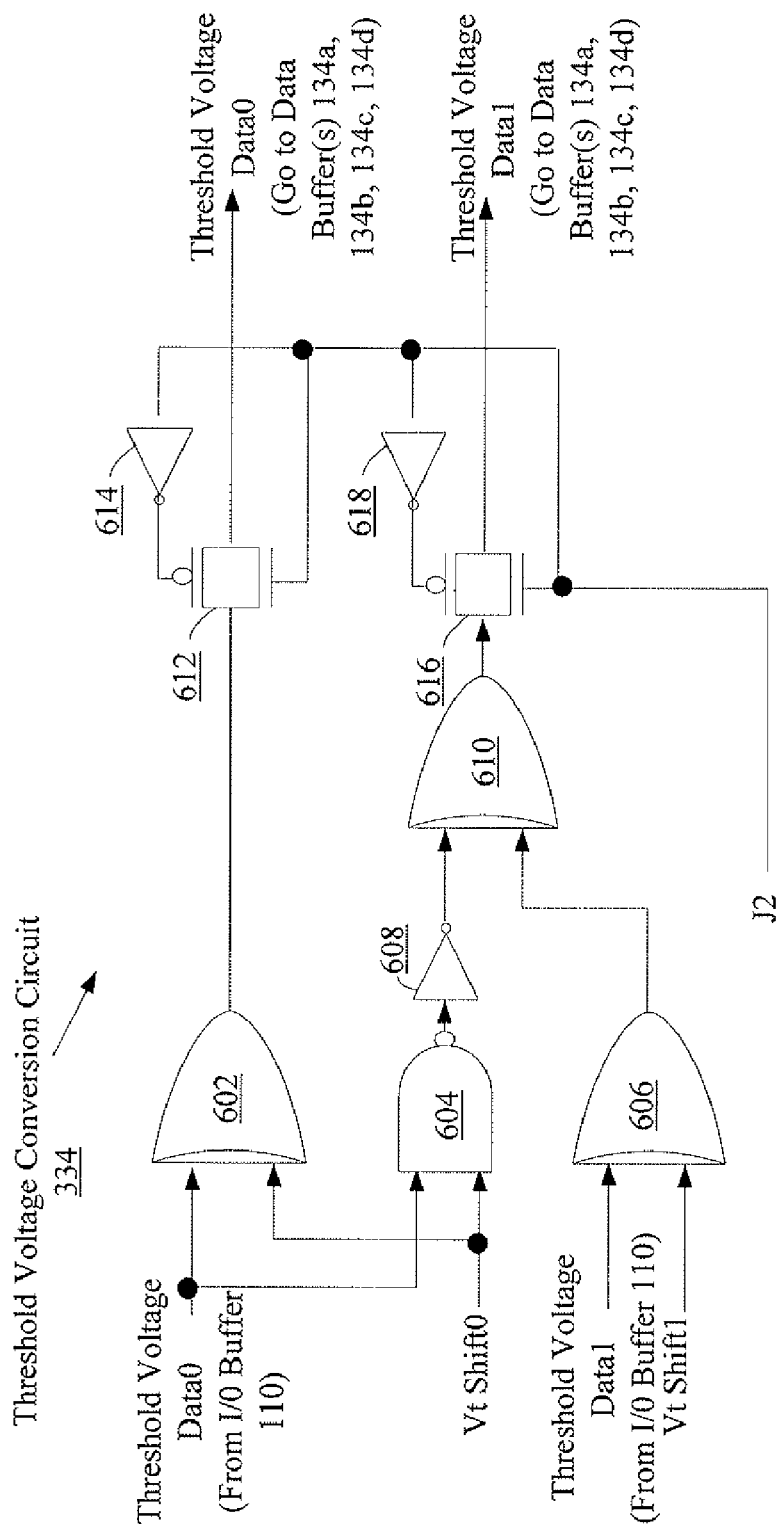
FIG. 6 is a schematic illustration the threshold voltage conversion circuit shown in FIG. 3 according to an embodiment of the present invention.

Referring now to FIG. 6, there is provided a schematic illustration of the TVC circuit 334 of FIG. 3 according to an embodiment of the present invention. The TVC circuit 334 is generally configured to periodically change the order of the data that is to be written to a plurality of different blocks (or planes) of a non-volatile memory device. As shown in FIG. 6, the TVC circuit 334 comprises exclusive-OR gates 602, 606, 610, a NAND gate 604, NOT gates 608, 614, 618, and switches 612, 616. When the command judge signal "J2" is at a first preselected level (e.g., a low level), data received from the I/O buffer 110 is forwarded to the data buffers 134a, 134b, 134c, 134d. In contrast, when the command judge signal "J1" is a second preselected level (e.g., a high level), the order of the data segments received from the I/O buffer 110 is periodically changed by a certain amount (e.g., Vt Shift0 or Vt Shift1). For example, if the data segments has a first order of 0, 1, 2, 3 and the command judge signal "J1" is at the second preselected level, then the order of the data segments is periodically changed as follows {2, 3, 4, 1}, {3, 4, 1, 2}, {4, 1, 2, 3}. Embodiments of the present invention are not limited in this regard.

Figure 7:
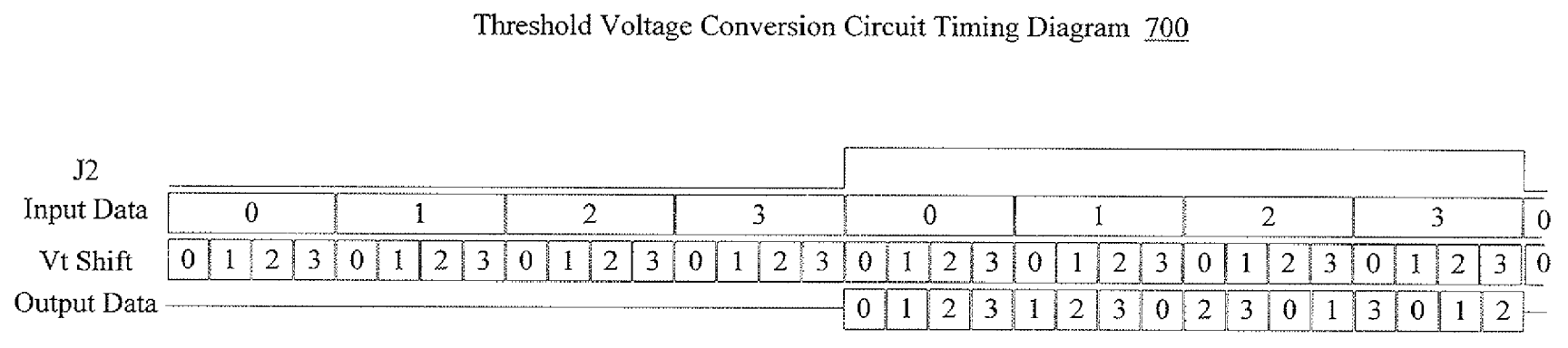

An exemplary timing diagram 700 of the TVC circuit 334 is shown in FIG. 7. As shown in FIG. 7, the input data is not shifted when the command judge signal "J2" is at a first preselected level (e.g., a low level). However, the order of the input data segments 0, 1, 2, 3 is periodically shifted by "K" places to the left when the command judge signal "J2" is at a second preselected level (e.g., a high level). Embodiments of the present invention are not limited in this regard. The order of the data segments can be periodically shifted by any places to the right or left in accordance with a particular non-volatile memory application.

Figure 8:
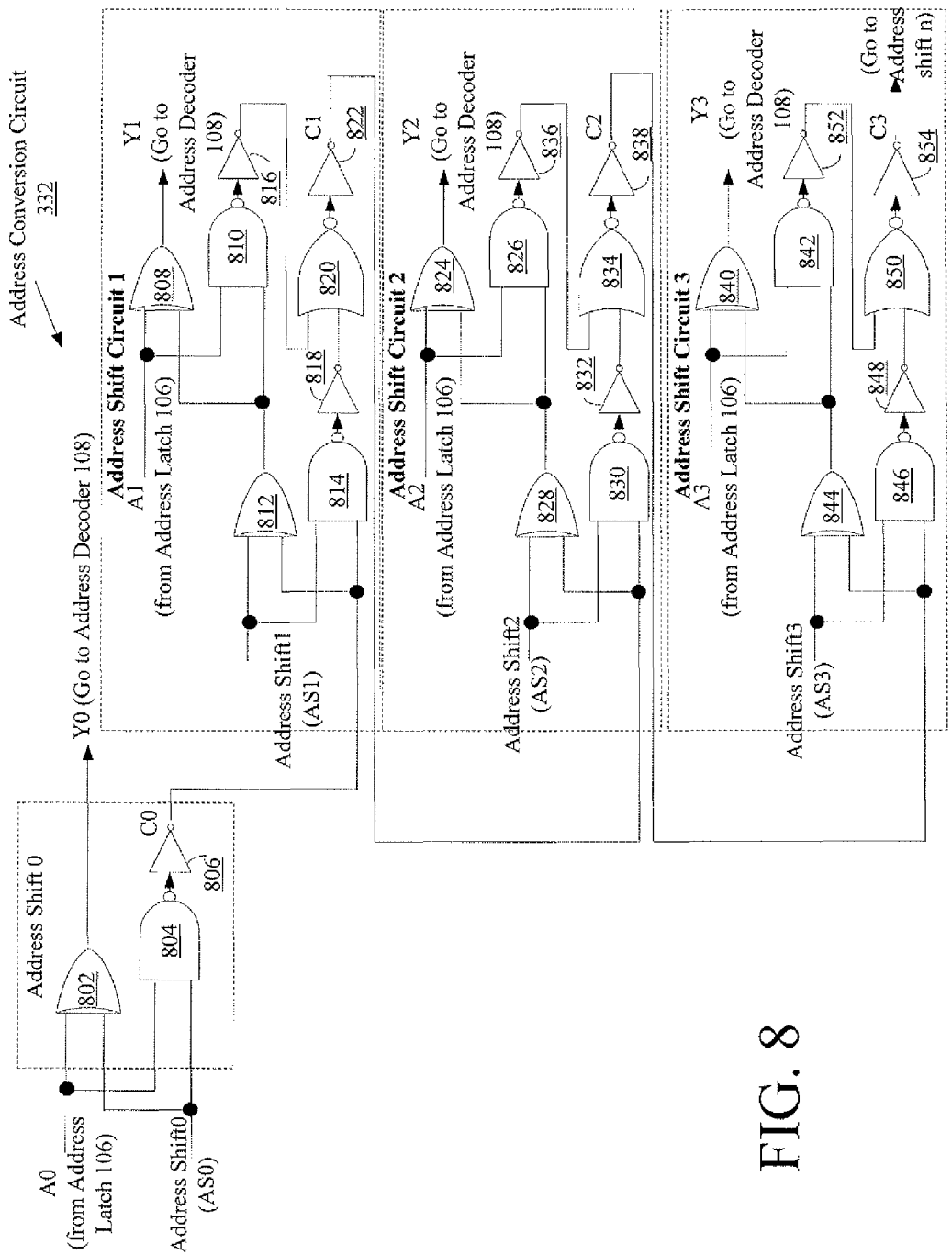
FIG. 8 is a schematic illustration of the address conversion circuit shown in FIG. 3 according to an embodiment of the present invention.

Referring now to FIG. 8, there is provided a schematic illustration of the AC circuit 332 of FIG. 1 according to an embodiment of the present invention. The AC circuit 332 is generally configured to periodically change the memory addresses to which data is to be programmed. As shown in FIG. 8, the AC circuit 332 comprises exclusive-OR gates 802, 808, 812, 824, 828, 840, 844, NAND gates 804, 810, 814, 826, 830, 842, 846, NOT gates 806, 816, 822, 836, 838, 848, 852, 854, and NOR gates 820, 834, 850.

The AC circuit 332 generally performs shift operations for changing the values of address data A0, A1, A2, A3 by a certain amount AS0, AS1, AS2, AS3. The amounts AS0, AS1, AS2, AS3 are selected so that the resulting address values of the shift operations are target address values Y1, Y2, Y3, Y4 associated with the address data values A0, A1, A2, A3. The target address values Y1, Y2, Y3, Y4 are communicated from the AC circuit 332 to the address decoder 108 of FIG. 1. The output signals C1, C2, C3, C4 are overflow signals which are fed to respective subsequent address shift circuits 1, 2, ..., n.

Figure 9:
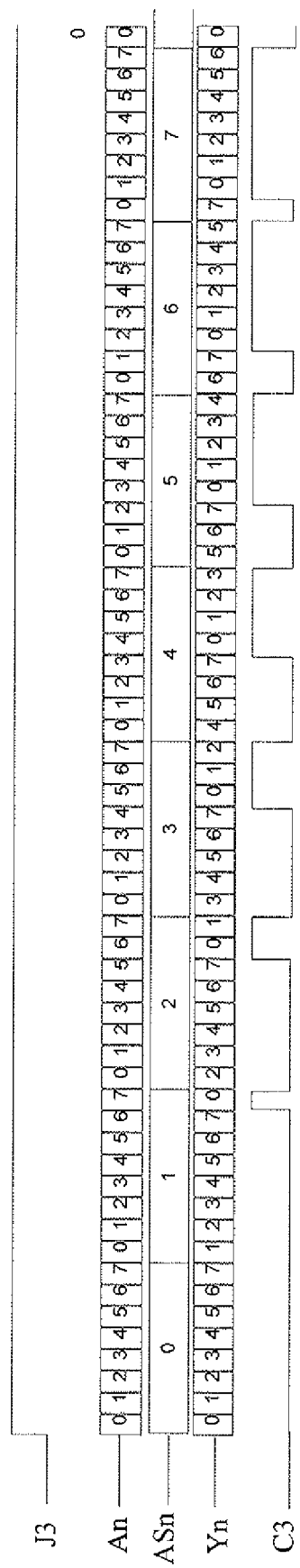
FIG. 9 is an exemplary timing diagram for the address conversion circuit shown in FIG. 8.

An exemplary timing diagram 900 of the AC circuit 332 is provided in FIG. 9. As shown in FIG. 9, the input address data includes a plurality of segments formed of "Q" (e.g., eight) sequentially ordered components. The order of the "Q" components is changed in accordance with a particular address shift value ASn. For example, if the address shift value ASn is zero (0), then the order of the "Q" components is not changed.

If the address shift value ASn is one (1), then the order of the "Q" components is shifted by one (1) place to the left. Similarly, if the address shift value ASn is two (2), then the order of the "Q" components is shifted by two (2) places to the left, and so on. Embodiments of the present invention is not limited in this regard. The order of the "Q" components can be shifted by any amount to the right or left in accordance with a particular non-volatile memory application.

Figure 11:
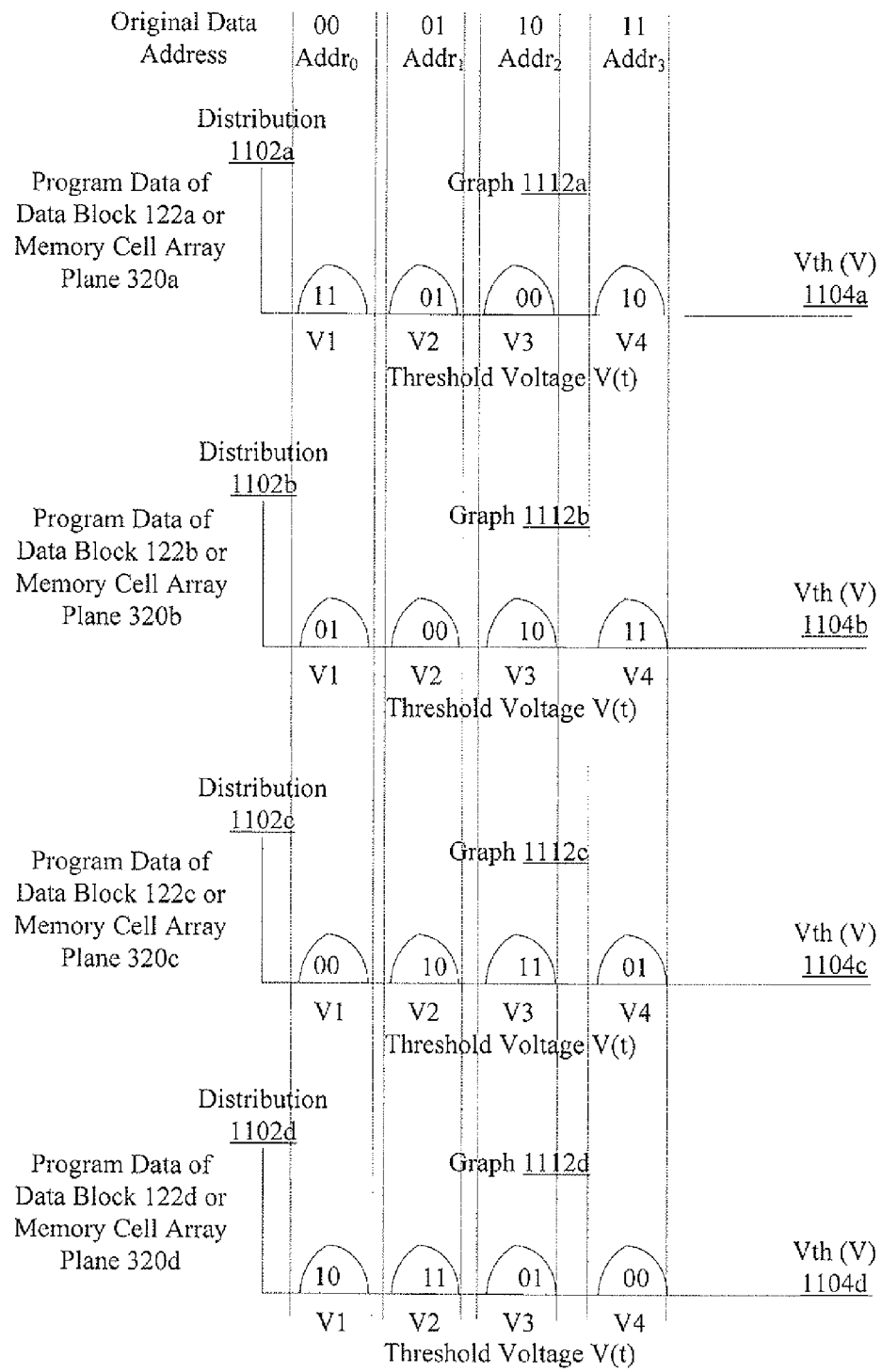
FIG. 11 is a plurality of graphs that are useful for understanding a method for programming non-volatile memory after multi-level data has been converted to binary data by a data conversion circuit (e.g., the data conversion circuit of FIG. 3).

Referring now to FIG. 11, there is provided a plurality of graphs 1112a, 1112b, 1112c, 1112d that are useful for understanding a method for programming non-volatile memory after multi-level data has been converted to binary data by a data conversion circuit (e.g., the data conversion circuit 130 of FIG. 3). As shown in FIG. 11, the original binary data can be defined by a numerical sequence (e.g., 00 01 10 11). The first set of bits (e.g., 00) of the original binary data is associated with a first original address $Addr_0$. The second set of bits (e.g., 01) of the original data is associated with a second original $Addr_1$. The third set of bits (e.g., 10) of the original data is associated with a third original $Addr_2$. The fourth set of bits (e.g., 11) of the original data is associated with a fourth original $Addr_3$.

The threshold voltage of the cell transistors of the data blocks 122a, 122b, 122c, 122d or memory cell array planes 1020a, 1020b, 1020c, 1020d associated with address $Addr_0$ is V1 (e.g., 1 volt). The threshold voltage of the cell transistors of the data blocks 122a, 122b, 122c, 122d or memory cell array planes 1020a, 1020b, 1020c, 1020d associated with address $Addr_1$ is V2 (e.g., 2 volts). The threshold voltage of the cell transistors of the data blocks 122a, 122b, 122c, 122d or memory cell array planes 1020a, 1020b, 1020c, 1020d associated with address $Addr_2$ is V3 (e.g., 3 Volts). The threshold voltage of the cell transistors of the data blocks 122a, 122b, 122c, 122d or memory cell array planes 1020a, 1020b, 1020c, 1020d associated with address $Addr_3$ is V3 (e.g., 4 Volts). Notably, each of the threshold voltages V1, V2, V3, V4 has a different value. The converted data is programmed to the data blocks 122a, 122b, 122c, 122d or memory cell array planes 1020a, 1020b, 1020c, 1020d based on the threshold voltages V1, V2, V3, V4. As a result of programming data into different addresses having different threshold voltages, defective data programming is prevented.

Figure 12:
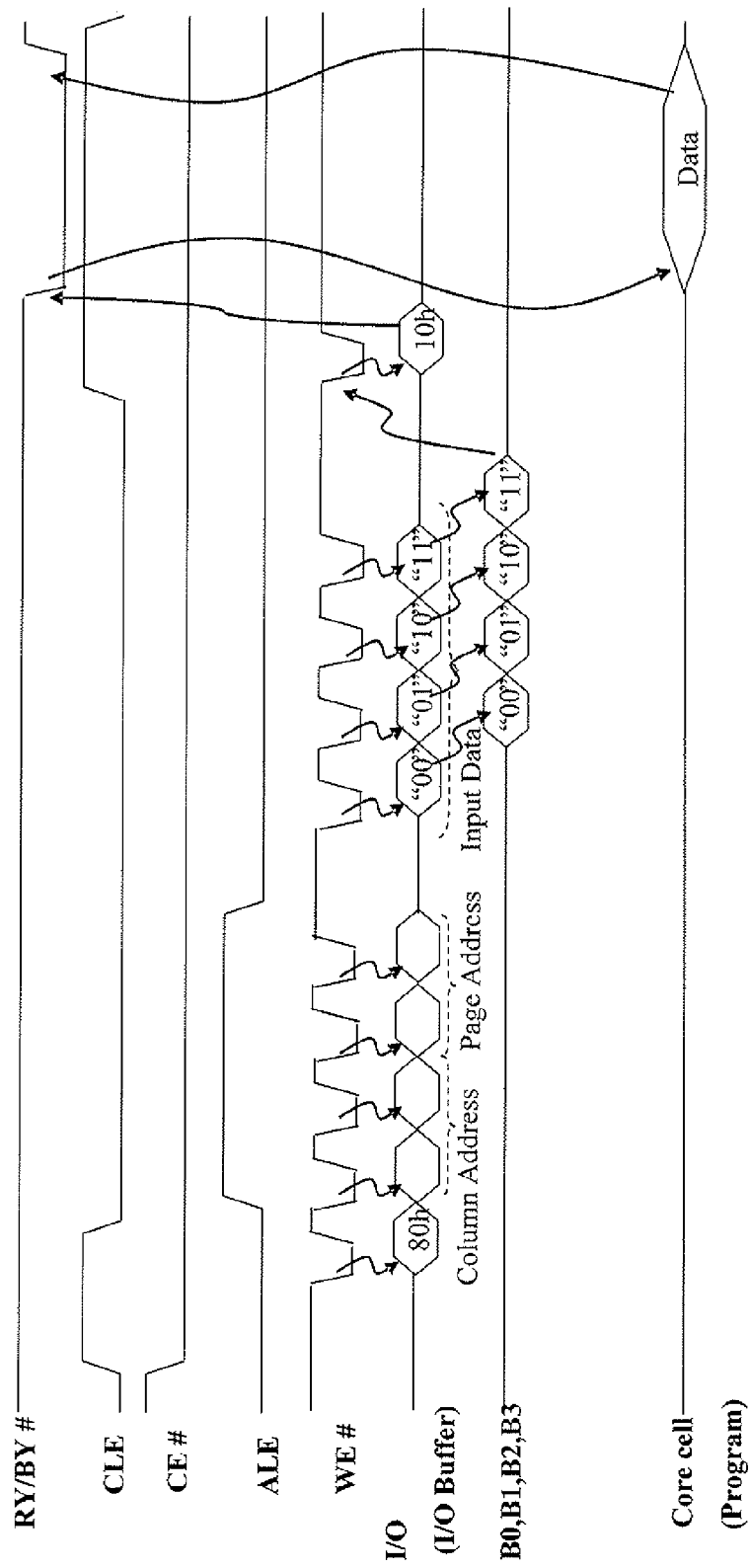
FIG. 12 is a schematic illustration of a normal mode program operation timing diagram according to an embodiment of the present invention.

FIG. 12 is a schematic illustration of a normal mode program operation timing diagram according to an embodiment of the present invention. As shown in FIG. 12, a first command is communicated from an external device to a command decoder (e.g., the command decoder 102 of FIG. 1) via an I/O signal. The first command is provided for placing the command decoder in its normal program mode. According to an embodiment of the present invention, the first command is defined as "80h". The present invention is not limited in this regard. Next, column and page addresses are communicated from the external device to the command decoder via the I/O signal. Thereafter, program data is communicated from the external device to the command decoder, I/O buffer (e.g., the I/O buffer 110 of FIG. 1), and at least one data buffer (e.g., the data buffers 134a, 134b, 134c, and/or 134d of FIG. 1). Subsequently, a second command is communicated from the external device to the command decoder via the I/O signal. The second command is provided for starting normal mode programming operations to program data into a core cell (i.e., a data block 122a, 122b, 122c, 122d of a memory cell array 120 of FIG. 1 and/or a memory cell array plane 1020a, 1020b, 1020c, 1020d of FIG. 10). According to an embodiment of the present invention, the second command is defined as "10h".

The present invention is not limited in this regard.

Figure 13:
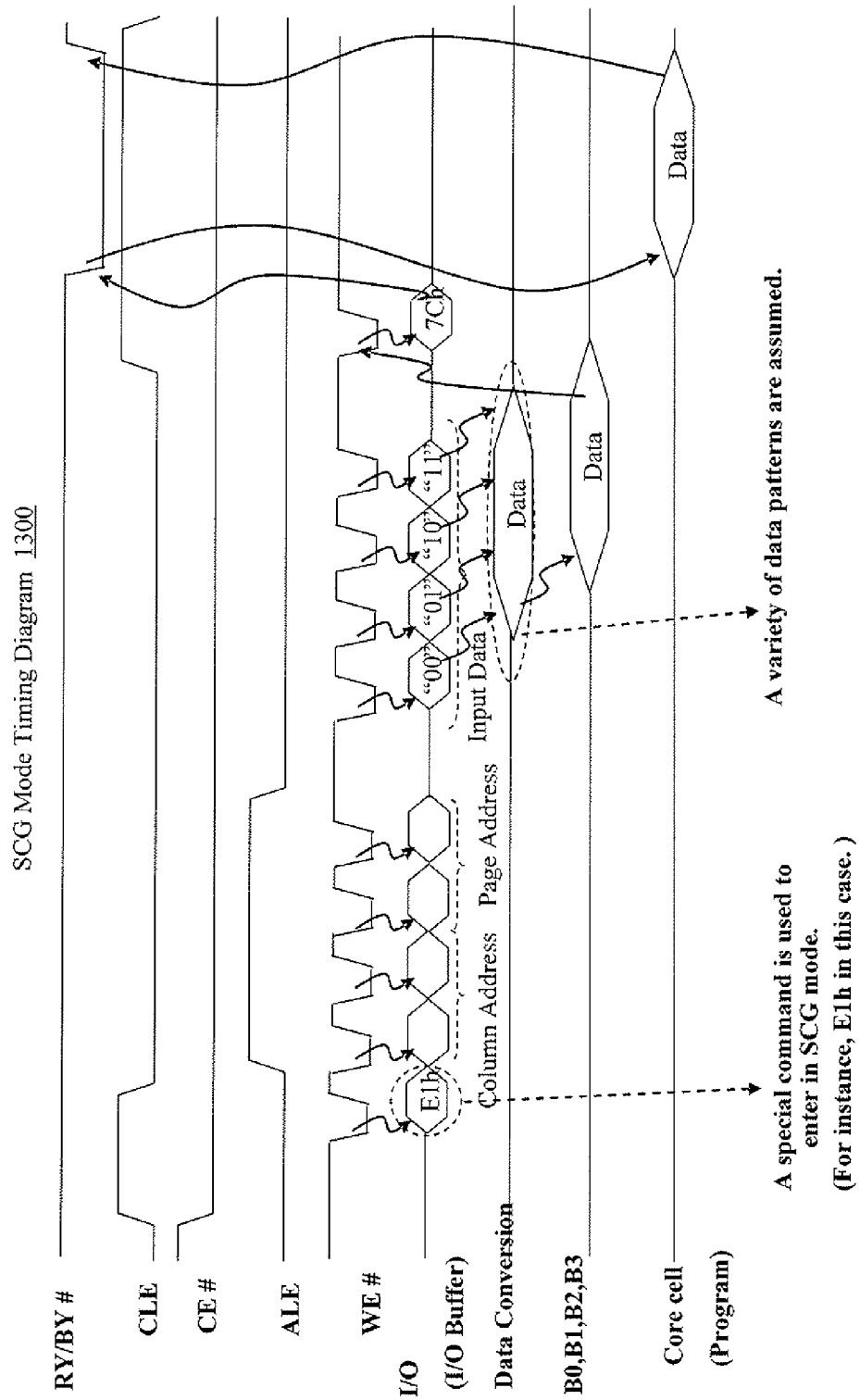
FIG. 13 is a schematic illustration of a Super Code Grade mode program operation timing diagram according to an embodiment of the present invention.

FIG. 13 is a schematic illustration of a Super Code Grade mode program operation timing diagram according to an embodiment of the present invention. As shown in FIG. 13, a first special command is communicated from an external device to a command decoder (e.g., the command decoder 102 of FIG. 1) via an I/O signal. The first special command is provided for placing the command decoder in its SCG mode. According to an embodiment of the present invention, the special command is defined as "E0h". The present invention is not limited in this regard. Next, column and page addresses are communicated from the external device to the command decoder via the I/O signal. Thereafter, program data is communicated from the external device to the command decoder, I/O buffer (e.g., the I/O buffer 110 of FIG. 1), and at least one data buffer (e.g., the data buffers 134a, 134b, 134c, and/or 134d of FIG. 1). Subsequently, a second special command is communicated from the external device to the command decoder via the I/O signal. The second command is provided for starting SCG programming operations to program data into a core cell (i.e., a plurality of data blocks 122a, 122b, 122c, 122d of a memory cell array 120 of FIG. 1 and/or a plurality of memory cell array planes 1020a, 1020b, 1020c, 1020d of FIG. 10).

Figure 14A:
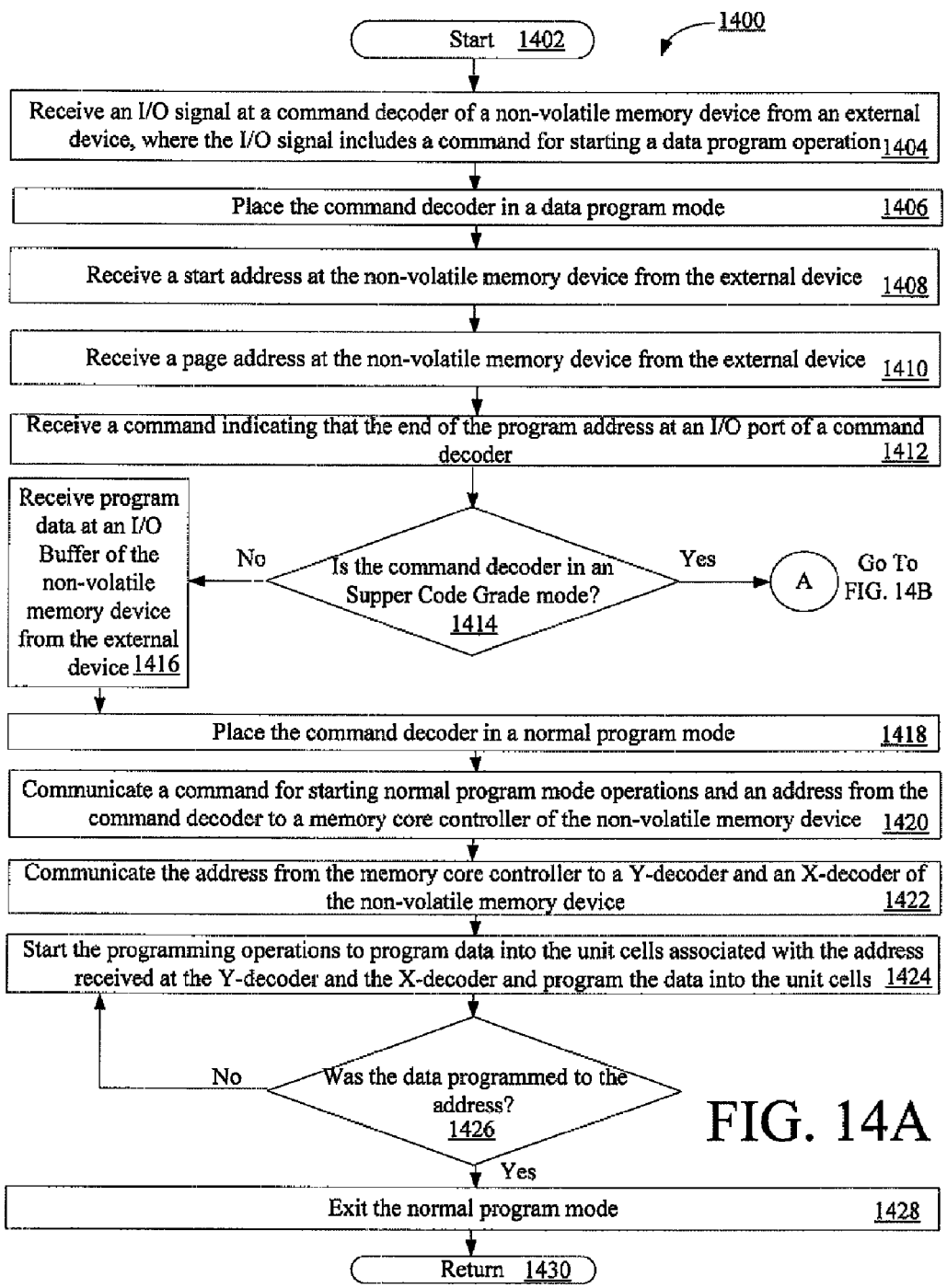

The following FIGS. 14A-14B and accompanying text illustrate a method 1400 according to an embodiment of the present invention for programming the non-volatile memory device (e.g., the non-volatile memory device 100 of FIG. 1). It should be appreciated, however, that the method 1400 disclosed herein is provided for purposes of illustration only and that embodiments of the present invention are not limited solely to the method shown.

Referring now to FIGS. 14A-14B, there is provided a flow diagram of an exemplary method 1400 for programming a non-volatile memory device according to an embodiment of the present invention. As shown in FIG. 14A, the method 1400 begins with step 1402 and continues to step 1404. In step 1404, an I/O signal is received at the I/O port (e.g., I/O port 150 of FIG. 1) of a command decoder (e.g., the command decoder 102 of FIG. 1). The I/O signal is a signal generated by an external device (not shown) that includes a command for starting a data program operation. In response to the received command, step 1406 is performed where the command decoder (e.g., the command decoder 102 of FIG. 1) is placed in a data program mode. In this data program mode, the command decoder performs a normal program mode operation of an SCG operation for programming data into the one or more data blocks (e.g., block 122a, 122b, 122c, or 122d) and/or planes (e.g., memory cell array planes 1020a, 1020b, 1020c, 1020d) of a non-volatile memory device.

Subsequent to being placed in its data program mode, steps 1408 and 1410 are performed. In steps 1408 and 1410, a start address and a page address are received the non-volatile memory device from an external device (not shown). The start and page addresses are temporarily stored in the address latch (e.g., the address latch 106 of FIG. 1) for subsequent use by the non-volatile memory device. Upon completion of step 1410, the method 1400 continues with step 1412. Step 1412 involves receiving a command at the I/O port of the command decoder from the external device, where the command indicates the end of the program address.

In response to receiving the command indicating the end of the program address, a decision step 1414 is performed. If the command decoder (e.g., the command decoder 102 of FIG. 1) is not in a Super Code Grade (SCG) mode [1414:NO], then the method 1400 continues with step 1416. Step 1416 involves receiving program data at an I/O buffer (e.g., the I/O buffer 110 of FIG. 1) from the external device. Subsequent to receiving the program data, step 1418 is performed where the command decoder (e.g., the command decoder 102 of FIG. 1) is placed in a normal program mode. In this normal program mode, the command decoder (e.g., the command decoder 102 of FIG. 1) generally executes a data program for performing at least one data program operation for programming a logic "1" into at least one unit cell and/or at least one erase data program operation for programming a logic "0" into at least one unit cell of a single block (e.g., block 122a, 122b, 122c, or 122d) or planes (e.g., memory cell array planes 1020a, 1020b, 1020c, 1020d) of a non-volatile memory device.

In response to being placed in its normal program mode, steps 1422-1430 are performed. In step 1422, the command decoder (e.g., the command decoder 102 of FIG. 1) communicates a command to the memory core controller (e.g., the memory core controller 104 of FIG. 1) for starting normal program operations. Step 1422 also involves communicating an address from the command controller to the memory core controller. In step 1424, the programming operations are started to program data into the unit cells associated with the address received at the Y-decoder and X-decoder. Step 1424 also involves programming the data into the unit cells associated with the address. Thereafter, the method 1400 continues with a decision step 1426. If the data was not programmed to the address [1426:NO], then the method 1400 returns to step 1424. If the data was programmed to the address [1428:YES], then step 1428 is performed where the normal program mode is exited. Subsequently, step 1430 is performed where the method 1400 returns to step 1402 or subsequent processing is resumed.

If the command decoder (e.g., the command decoder 102 of FIG. 1) is in the SCG mode [1414:YES], then the method 1400 continues with a decision step 1432 of FIG. 14B. In this SCG mode, the command decoder (e.g., the command decoder 102 of FIG. 1) generally executes a data program for performing at least one data program operation for programming a logic "1" into at least one unit cell and/or at least one erase data program operation for programming a logic "0" into at least one unit cell of a plurality of data blocks (e.g., block 122a, 122b, 122c, and 122d) or planes (e.g., memory cell array planes 1020a, 1020b, 1020c, 1020d) of a non-volatile memory device based on threshold voltages of unit cells contained therein.

If the code sector (e.g., the code sector 140 of FIG. 1) is set [1432:YES], then the method 1400 continues with step 1436 which will be described below. If the code sector (e.g., the code sector 140 of FIG. 1) is not set [1432:NO], then the method 1400 continues with steps 1434-1454. In step 1434, the code sector is set. Thereafter, a next step 1436 is performed. Step 1436 involves receiving program data at the I/O buffer of the non-volatile memory from the external device. In step 1440, a command for starting SCG programming operations is communicated from the command decoder to the memory core controller of the non-volatile memory device. The command decoder also communicates an address to the memory core controller. Thereafter, the memory core controller communicates an address to the Y-decoder and X-decoder in step 1442. In step 1444, program data is communicated from the I/O buffer to a data conversion circuit (e.g., the data conversion circuit 130 of FIG. 3) of the non-volatile memory device. At the data conversion circuit, the program data is converted from a multi-level data format to a binary data format. This data conversion is performed in step 1446. After the data has been converted to a binary data format, the method 1400 continues with step 1448. In step 1448, the converted data is programmed to unit cells of a plurality of data blocks (e.g., data blocks 122a, 122b, 122c, 122d of FIG. 1) or a plurality of planes (e.g., planes 1030a, 1030b, 1030c, 1030d of FIG. 10) of a non-volatile memory device based on threshold voltages (as described above in relation to FIG. 11) of unit cells contained therein.

After programming the data into the memory cell array(s), the method continues with a decision step 1450. If the data was programmed to all of the addresses [1450:NO], then the method 1400 returns to step 1448. If the data was not programmed to all of addresses [1450:YES], then step 1452 is performed where the SCG program mode is exited. Next, step 1454 is performed where the method 1400 returns to step 1404 or subsequent processing is resumed.

In light of the forgoing description of the invention, it should be recognized that the present invention can be realized in hardware, software, or a combination of hardware and software. A method for programming non-volatile memory according to the present invention can be realized in a centralized fashion in one processing system, or in a distributed fashion where different elements are spread across several interconnected processing systems. Any kind of computer system, or other apparatus adapted for carrying out the methods described herein, is suited. A typical combination of hardware and software could be a general purpose computer processor, with a computer program that, when being loaded and executed, controls the computer processor such that it carries out the methods described herein. Of course, an application specific integrated circuit (ASIC), and/or a field programmable gate array (FPGA) could also be used to achieve a similar result.

Applicants present certain theoretical aspects above that are believed to be accurate that appear to explain observations made regarding embodiments of the present invention. However, embodiments of the present invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others having ordinary skill in the art upon the reading and understanding of this specification and the annexed drawings. In addition, while a particular feature of the present invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method for programming program data to a memory device, comprising:
    receiving the program data, including a plurality of numbers, at the memory device from an external data source, where
        the memory device includes a memory cell array configured to store the program data in a plurality of data blocks or a plurality of memory cell array planes,
        each data block and each memory cell array plane includes a plurality of memory addresses corresponding to locations of respective transistor circuits within the memory cell array,
        each of the transistor circuits includes at least one unit cell transistor configured to have at least one of the plurality of numbers programmed thereto, and
        the unit cell transistor of a first one of the transistor circuits has a different threshold voltage with respect to the unit cell transistor of at least a second one of the transistor circuits; and
    programming the program data to each of the plurality of data blocks or each of the plurality of memory cell array planes in accordance with a first mode in which each of the plurality of numbers is programmed to a different memory address of each of the plurality of data blocks or each of the plurality of memory cell array planes based at least in part on the different threshold voltage.

2. The method according to claim 1, wherein the memory device is a non-volatile memory device.

3. The method according to claim 1, wherein the memory device is at least one of a flash memory device, a Resistive Random Access Memory device, or a Phase Change Memory device.

4. The method according to claim 1, further comprising changing an order of the plurality of numbers prior to programming the program data to one of the plurality of data blocks or one of the plurality of memory cell array planes.

5. The method according to claim 1, further comprising changing values of a plurality of memory address identifiers contained in a signal received at the memory device prior to programming the program data to one of the plurality of data blocks or one of the plurality of memory cell array planes.

6. The method according to claim 1, further comprising substituting a value for at least one memory address identifier contained in a signal received at the memory device with at least one substitute value prior to programming the program data to each of the plurality of data blocks or each of the plurality of memory cell array planes.

7. The method according to claim 1, further comprising converting the program data from a non-binary format to a binary format prior to programming the program data to each of the plurality of data blocks or each of the plurality of memory cell array planes.

8. A memory device, comprising:
   an Input/Output buffer configured to communicate program data, including a plurality of numbers, to and from an external data source;
   at least one memory cell array that is configured to store the program data in a plurality of data blocks, wherein
      the plurality of data blocks includes a plurality of memory addresses corresponding to locations of transistor circuits within the memory cell array,
      each of the transistor circuits includes at least one unit cell transistor configured to have at least one of the plurality of numbers programmed therein, and
      the unit cell transistor of a first one of the transistor circuits has a different threshold voltage with respect to the unit cell transistor of at least a second one of the transistor circuits; and
   a data converter that is communicatively coupled to the Input/Output buffer and the memory cell array, wherein the data converter is configured to program the program data to each of the plurality of data blocks in accordance with a first mode in which each of the plurality of numbers is programmed to a different memory address of each of the plurality of data blocks based at least in part on the different threshold voltage.

9. The memory device according to claim 8, wherein the memory device is a non-volatile memory device.

10. The memory device according to claim 1, wherein the memory device is at least one of a flash memory device, a Resistive Random Access Memory device, or a Phase Change Memory device.

11. The memory device according to claim 8, wherein the data converter further includes a mode judgment circuit for setting a mode of the data converter in accordance with at least one command received from a command generator of the memory device.

12. The memory device according to claim 11, wherein the data converter further includes an address degeneracy circuit communicatively coupled to the mode judgment circuit, the address degeneracy circuit is configured to
   receive memory address data from an address latch of the memory device and a command signal from the mode judgment circuit, and
   substitute at least one memory address value contained in the memory address data with at least one substitute memory address value when the command signal is at a preselected level.

13. The memory device according to claim 11, wherein the data converter further includes a threshold voltage conversion circuit communicatively coupled to the mode judgment circuit, the threshold voltage conversion circuit is configured to
   receive at least one data signal containing ordered data from the Input/Output buffer and a command signal from the mode judgment circuit, and
   periodically change an order of the ordered data when the command signal is at a first preselected level.

14. The memory device according to claim 11, wherein the data converter further includes an address conversion circuit communicatively coupled to the mode judgment circuit, the address conversion circuit is configured to
   receive a plurality of memory addresses from an address latch of the memory device and a command signal from the mode judgment means, and
   periodically change a value of each of the plurality of memory addresses when the command signal is at a preselected level.

15. The memory device according to claim 8, wherein the data converter is further configured to program the same program data to each of the plurality of data blocks by shifting a memory address at each of said plurality of data blocks so that a reliability of the program data stored in the plurality of data blocks is relatively high.

16. The memory device according to claim 8, wherein the data converter is further configured to program a logic "0" to the unit cell transistor by applying a first voltage at a drain of the unit cell transistor, a second voltage at a gate of the unit cell transistor, and a third voltage at a source of the unit cell transistor, where the values of the first, second and third voltages are such that the threshold voltage of the unit cell transistor is greater than a reference voltage.

17. The memory device according to claim 8, wherein the data converter is further configured to program a logic "1" to the unit cell transistor by applying a first voltage at a drain, a second voltage at a gate, and a third voltage at a source of the unit cell transistor, where the first, second and third voltages are such that the threshold voltage of the unit cell transistor is less than a reference voltage.

18. The memory device according to claim 8, wherein the data convertor includes a means for shifting a memory address at each of said plurality of data blocks, or wherein said at least one memory cell array includes means for programming logic "0s" and logic "1s" to the transistor circuits.

19. A non-volatile memory device, comprising:
   an Input/Output buffer configured to communicate program data, including a plurality of numbers, to and from an external data source
   a plurality of memory cell array planes that are configured to store the program data, wherein
      the plurality of memory cell array planes include a plurality of memory addresses corresponding to locations of transistor circuits within the memory cell array,
      each of the transistor circuits includes at least one unit cell transistor configured to have at least one of the plurality of numbers programmed therein, and
      the unit cell transistor of a first one of the transistor circuits has a different threshold voltage with respect to the unit cell transistor of at least a second one of the transistor circuits; and
   a data converter that is communicatively coupled to the Input/Output buffer and the plurality of memory cell array planes, wherein the data converter is configured to program the program data to each of the plurality of memory cell array planes in accordance with a first mode in which each of the plurality of numbers is programmed to a different memory address of each of the plurality of memory cell array planes based at least in part on the different threshold voltage.

20. The non-volatile memory device according to claim 19, wherein the non-volatile memory device is at least one of a flash memory device, a Resistive Random Access Memory device, or a Phase Change Memory device.

* * * * *

UNITED STATES PATENT AND TRADEMARK OFFICE
CERTIFICATE OF CORRECTION

| | |
|---|---|
| PATENT NO. | : 8,085,588 B2 |
| APPLICATION NO. | : 12/433084 |
| DATED | : December 27, 2011 |
| INVENTOR(S) | : Naoharu Shinozaki et al. |

It is certified that error appears in the above-identified patent and that said Letters Patent is hereby corrected as shown below:

In column 3, line 39, delete ""N"" and insert -- "N" --, therefor.

In column 6, line 3, delete "as a an" and insert -- as an --, therefor.

Signed and Sealed this
Twenty-sixth Day of June, 2012

David J. Kappos
*Director of the United States Patent and Trademark Office*